United States Patent
Natsume

(10) Patent No.: US 8,142,751 B2
(45) Date of Patent: Mar. 27, 2012

(54) SILICON MONOXIDE VAPOR DEPOSITION MATERIAL AND PROCESS FOR PRODUCING THE SAME

(75) Inventor: Yoshitake Natsume, Amagasaki (JP)

(73) Assignee: OSAKA Titanium technologies Co., Ltd., Amagasaki-shi (JP)

( * ) Notice: Subject to any disclaimer, the term of this patent is extended or adjusted under 35 U.S.C. 154(b) by 426 days.

(21) Appl. No.: 11/916,452

(22) PCT Filed: Jun. 5, 2006

(86) PCT No.: PCT/JP2006/311190
§ 371 (c)(1),
(2), (4) Date: May 9, 2008

(87) PCT Pub. No.: WO2006/134792
PCT Pub. Date: Dec. 21, 2006

(65) Prior Publication Data
US 2009/0117023 A1   May 7, 2009

(30) Foreign Application Priority Data
Jun. 16, 2005   (JP) ................. 2005-176244

(51) Int. Cl.
*C01B 15/14* (2006.01)
*C01B 33/20* (2006.01)
*C04B 41/50* (2006.01)
(52) U.S. Cl. .................... 423/325; 106/287.1
(58) Field of Classification Search .............. 423/325; 106/287.1
See application file for complete search history.

(56) References Cited

U.S. PATENT DOCUMENTS

| | | | | |
|---|---|---|---|---|
| 3,010,839 A | * | 11/1961 | Drumheller et al. | 106/286.8 |
| 3,728,436 A | * | 4/1973 | Krikorov et al. | 423/325 |
| 7,151,068 B2 | * | 12/2006 | Natsume et al. | 501/154 |
| 2004/0182700 A1 | * | 9/2004 | Natsume et al. | 204/298.13 |
| 2007/0259113 A1 | * | 11/2007 | Kizaki et al. | 427/255.37 |

FOREIGN PATENT DOCUMENTS

| | | | |
|---|---|---|---|
| JP | 63166965 A | * | 7/1988 |
| JP | 63-310961 | | 12/1988 |
| JP | 04028858 A | * | 1/1992 |
| JP | 2003-246670 | | 9/2003 |
| JP | 2004076120 A | * | 3/2004 |
| JP | 2004323324 A | * | 11/2004 |
| WO | 03/010112 | | 2/2003 |

* cited by examiner

Primary Examiner — Stanley Silverman
Assistant Examiner — Anthony J Zimmer
(74) Attorney, Agent, or Firm — Oblon, Spivak, McClelland, Maier & Neustadt, L.L.P.

(57) ABSTRACT

In a powder-sintered type silicon monoxide based evaporating material which is used to form an evaporated film of silicon monoxide, the generation of splash is restrained. Material strength that can resist against the use of the material is ensured. In order to realize these, a starting powder made of precipitating SiO is sintered at 700 to 1000° C. to form an evaporating material. The precipitation of Si is restrained in the step of the sintering. In the measurement thereof by XRD, the peak strength P1 at a Si peak point generated near $2\theta=28°$ and the base strength P2 at the peak point expected from the average strength gradient before and after the peak point satisfies the following: $P1/P2 \leqq 3$. The compression fracture strength of the evaporating material after the material is sintered is raised to 5 MPa or more by selective use of precipitating SiO produced by a vacuum condensing machine.

4 Claims, 3 Drawing Sheets

PRECIPITATION-PRODUCE STARTING MATERIAL SiO

PULVERIZE THE PRECIPITATING SiO

FORM INTO TABLETS

SINTER

F I G 2
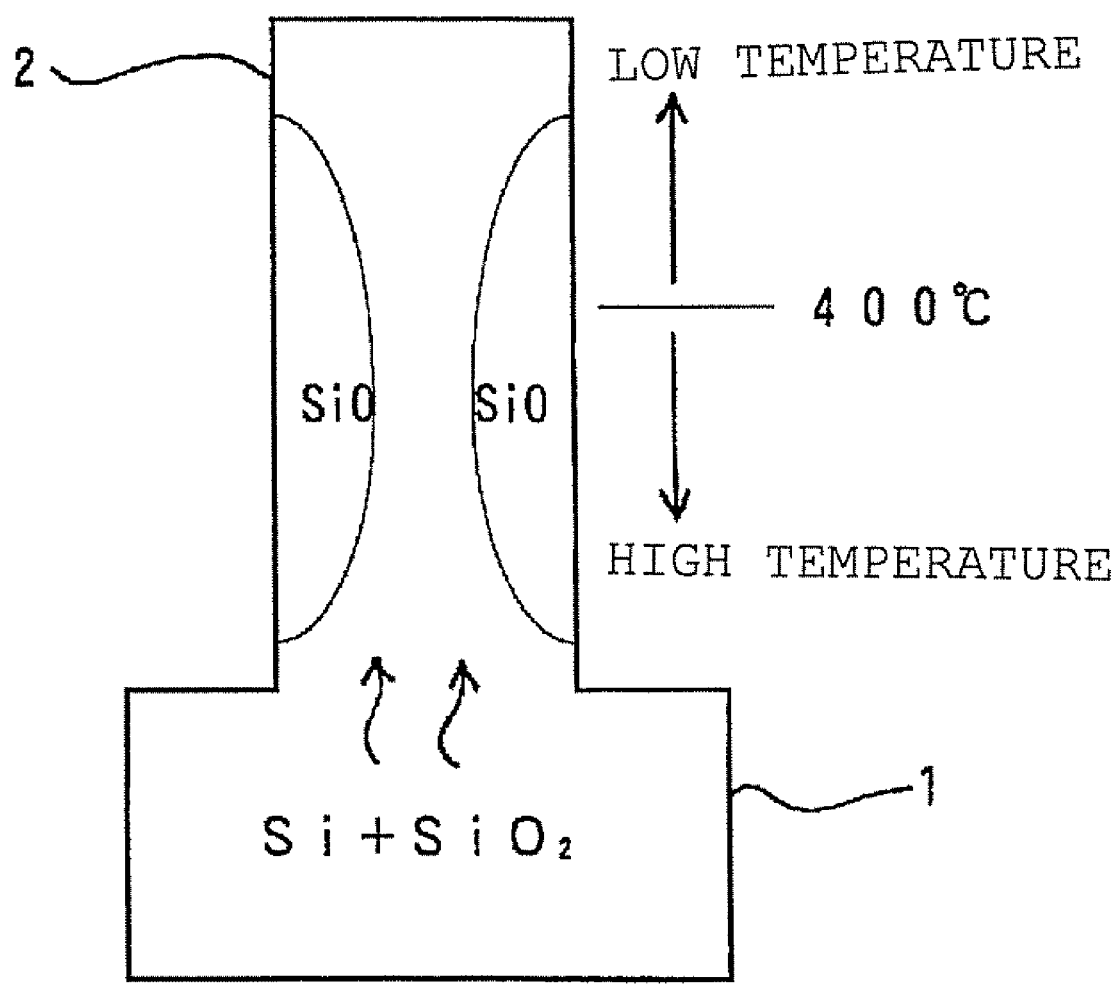

SILICON MONOXIDE VAPOR DEPOSITION MATERIAL AND PROCESS FOR PRODUCING THE SAME

TECHNICAL FIELD

The present invention relates to a powder-sintered type silicon monoxide based evaporating material which is used to form an evaporated film (vapor deposited film) of silicon monoxide, and a process for producing the same.

BACKGROUND ART

About packaging materials for food, medical supplies and others, and resin substrates of flat panel displays of liquid crystal, organic EL or the like, they are desired to have a high gas barrier property. From this viewpoint, known are gas barrier films wherein a metal such as aluminum or a metal oxide such as silicon oxide, aluminum oxide or magnesium oxide is evaporated on a polymer film substrate. Attention is paid in particular to a film wherein silicon monoxide is evaporated since the film has a high transparency and a high gas barrier property.

The evaporating material used to form such a silicon monoxide film is usually silicon monoxide produced by use of a vacuum condensing method. The vacuum condensing method is a method of mixing Si and $SiO_2$ with each other in a starting material chamber, heating the mixture, and causing SiO to gas-phase-precipitate on the inner surface of a tubular condensing chamber connected to the upper of the starting material chamber, thereby producing SiO. The produced SiO is a dense precipitation. In some cases, this is cut away into a predetermined tablet form, and the tablet is directly used as an evaporating material. In other cases, the precipitation is once pulverized into powder, this is sintered into a predetermined tablet form, and the tablet is used. The case that the sintered body is used as an evaporating material is more frequently performed since the bulk density and other characteristic values can each be controlled into a wide range.

Meanwhile, one out of phenomena which become problems in the process for forming a silicon monoxide evaporated film is splash. This is a finely splashing phenomenon of a molten material. When this is caused in the formation of a film, pinholes and other defects are generated in the formed evaporated film so that the quality of the film falls remarkably. This phenomenon becomes more remarkable as the film-forming speed is made higher. Thus, this is a cause of suffocating the film-forming speed. For this reason, in the work for forming a silicon monoxide evaporated film, the restraint of the generation of the splash is an important technical theme. To attain this theme, approaches are being tried from various viewpoints. From the viewpoint of an evaporating material, attempts for improving the density or brittleness of the material, and other physical properties thereof are being made.

Specifically, about physical properties of evaporating material, it is considered that splash is less generated as the material is denser and harder. In accordance with this thought, Patent Document 1 describes a gas-phase-precipitation type silicon monoxide based evaporation material wherein the weight decreasing rate (rattler value) in a rattler test is 1.0% or less. About the powder-sintered type silicon monoxide based evaporating material, Patent Document 2 states that it is effective to make the bulk density as high as 1.60 g/cm³ or more by hot press at a high temperature and a high pressure.

Patent Document 1: Japanese Patent Application National Publication No. 2003/025246

Patent Document 2: Japanese Patent Application National Publication No. 2003/010112

Such an evaporating material having improved physical properties (dense and hard material) is less broken when used. Thus, the convenience for use is good. About the restraint of splash, however, advantageous effects to be expected are not attained in the actual circumstances.

DISCLOSURE OF THE INVENTION

Problems to be Solved by the Invention

An object of the present invention is to provide a powder-sintered type silicon monoxide based evaporating material which makes it possible to restrain the generation of splash remarkably; and a process for producing the same. Another object of the present invention is to provide a powder-sintered type silicon monoxide based evaporating material which makes it possible to restrain the generation of splash remarkably and is less broken when the material is used, so as to give a good convenience for use; and a process for producing the same.

Means for Solving the Problems

As described above, according to the thought in the prior art, splash in work for evaporating silicon monoxide is caused by physical properties of an evaporating material, in particular, a low denseness thereof. In other words, according to the thought, splash is caused by a low denseness and a remarkable brittleness of a material. However, from results of various researches by the inventors, a new cause different from the above has surfaced. Specifically, the inventors have paid attention to the degree of the effect of the sintering temperature of powder-sintered type evaporating material onto splash, and examined this in detail. As a result, surprisingly, in the case of using an evaporating material sintered at a somewhat lower temperature than a known ideal value of the temperature at which the material is sintered, splash is effectively restrained. The inventors think that the reason for this is as follows:

In order to make the denseness high in the prior art, the powder sintering temperature is set to a high temperature such as 1200° C. or higher. In such high temperature sintering, SiO decomposes thermally in the sintering step, so that Si precipitates. In evaporating work, the precipitating Si is evaporated and scattered, and this causes splash. It cannot be denied that the brittleness of evaporating material may be a cause of splash; however, rather than the brittleness, the vaporization phenomenon of Si, which precipitates in the high temperature sintering in the evaporating step, dominates splash. Actually, evaporating materials sintered at various sintering temperatures have been subjected to XRD (X-ray diffraction spectroscopy), whereby it has been verified that as the sintering temperature lowers, the peak of Si disappears and splash also decreases sharply.

Meanwhile, a fall in the sintering temperature and a fall in the denseness based thereon cause breakdown in the evaporating material when the material is used. That is, the falls cause a deterioration of the convenience for use. It is therefore not preferred that in the process for producing the powder-sintered type material, the sintering temperature is merely lowered. Thus, the inventors have simultaneously researched a method for avoiding a fall in the mechanical strength when the sintering temperature is lowered. As a result, it has been found out that it is effective to use SiO precipitated at low temperature sites inside the condensing pipe out of SiO species which are raw materials of a powder-sintered type evaporating material, that is, precipitated SiO species produced by a vacuum condensing method. The reason for this will be described later.

The silicon monoxide based evaporating material of the present invention has been completed on the basis of this finding, and is an evaporating material wherein at the time of converting a raw data graph obtained therefrom by XRD to a shift average approximation curve by use of a data specifying number of 3, the relationship between the peak strength P1 at a Si peak point generated near $2\theta=28°$ on the curve and the base strength P2 at the peak point assumed from the average gradient before and after the peak point satisfies the following: $P1/P2 \leqq 3$.

Raw data obtained by XRD contain many noises. Thus, the graph of the raw data is converted to a shift average approximation curve so as to decrease the effect of the noises. At this time, the data specifying number is set to 3. Specifically, the average of three first values (the first, second and third values) of the raw data becomes a first value of a shift average approximation curve. Next, the average of the second, third and fourth raw data becomes a second value of the shift average approximation curve. Subsequently, the raw data are processed in the same way, thereby converting the raw data graph to the shift average approximation curve. In the thus-obtained shift average approximation curve, at the time of representing the peak strength at a Si peak point generated near $2\theta=28°$ by P1 and representing the base strength at the peak point assumed from the average gradient before and after the peak point by P2, the following is satisfied: $P1/P2 \leqq 3$. This is the silicon monoxide based evaporating material of the present invention. XRD measuring conditions for obtaining the raw data will be described later.

The base strength P2 is the so-called background level. The expression "$P1/P2 \leqq 3$" means that the peak strength at the Si peak point is small, and means that Si precipitation is restrained in a powder-sintered step in the production process.

In the silicon monoxide based evaporating material of the present invention, low temperature sintering is performed in the powder-sintering step in the production process, thereby restraining the precipitation of Si. In this way, in an evaporating step, which is a step of the use thereof, the generation of splash can be effectively restrained. Although the low temperature sintering is performed in the powder-sintering step, a sufficient mechanical strength for use can be ensured. Specifically, a compression fracture strength of 5 MPa or more, more preferably 10 MPa or more can be ensured.

The process for producing an evaporating material of the present invention is a process wherein at the time of producing a powder-sintered type silicon monoxide based evaporating material which is used to form an evaporated film of silicon monoxide, a starting material comprising precipitating SiO is sintered at 700 to 1000° C., and is preferably a process of producing a silicon monoxide based evaporating material having a compression fracture strength of 5 MPa or more by selective use of precipitated SiO produced by a vacuum condensing machine.

Effect of the Invention

The silicon monoxide based evaporating material of the present invention makes it possible to restrain the generation of splash remarkably by removing a Si peak based on XRD substantially. Moreover, mechanical strength can be easily ensured, whereby the material can be prevented from being broken when the material is used, and the material is very convenient for use.

In the process of the present invention for producing a silicon monoxide based evaporating material, an evaporating material, in which a Si peak based on XRD is substantially removed, can be produced by lowering a sintering temperature. In this way, the generation of splash can be remarkably restrained. Moreover, mechanical strength can be ensured by selective use of precipitated SiO produced by a vacuum condensing machine. As a result, an evaporating material very convenient for use can be produced.

BEST MODE FOR CARRYING OUT THE INVENTION

An embodiment of the present invention will be described on the basis of the drawings hereinafter. FIG. 1 is an explanatory view of the process for producing a silicon monoxide based evaporating material of the present invention, FIG. 2 is a structural view of a vacuum condensing machine used to produce a starting material (precipitated SiO), FIG. 3 is an XRD raw data graph of a produced evaporating material, and FIG. 4 is a shift average approximation curve obtained from the XRD raw data graph.

In the present embodiment, an evaporating material is produced through steps described hereinafter. In a first step, a starting material (precipitating SiO) is produced. In this step, for example, a vacuum condensing machine illustrated in FIG. 2 is used. The vacuum condensing machine illustrated in FIG. 2 is equipped with a starting material chamber 1 and a condensing chamber 2, in a circular tube form, connected to the upper thereof. In operation, a mixture of Si powder and $SiO_2$ powder is charged into the starting material chamber 1. The pressure in the chamber is reduced into a predetermined vacuum degree. The inside of the starting material chamber 1 is heated to a predetermined temperature (1200 to 1400° C.) with a heater arranged outside of the starting material chamber 1. In this way, a vapor of SiO is generated in the starting material chamber 1. This is introduced into the condensing chamber 2 arranged above.

In the condensing chamber 2, about the condensing pipe temperature, the outer surface temperature is controlled to several hundreds degrees. More specifically, the outer surface temperature of the condensing pipe is lowered from the upper to the bottom. In a temperature region from about 800 to 200° C., SiO precipitates. In the prior art, the SiO species precipitating in a high temperature region from about 800 to 400° C., out of the precipitating SiO species, is used as an evaporating material. SiO species precipitating in a lower temperature region than the region is not used. This is based on the following reasons:

Physical properties of precipitated SiO are varied in accordance with the precipitating temperature. Specifically, SiO precipitating in a lower temperature range is more brittle, and SiO precipitating in a higher range is better in denseness. SiO precipitating in a low temperature region such as from 200 to 400° C. is very brittle, and about precipitating type SiO, splash is frequently caused when the SiO is evaporated. For this reason, even sintered type SiO is not used as the starting material of an evaporating material. On the other hand, in the embodiment, SiO precipitating in this low temperature region is used as the starting material of a sintered type evaporating material. The low temperature precipitated SiO is good in compressibility of powder; thus, it is supposed that a fall in the strength at low temperature sintering in the case of the sintered type can be avoided. It is also supposed that the generation of splash at the time of evaporation, which is considered to be a problem in the prior art, does not particularly become a problem since the powder-sintered type SiO can be formed to have a high strength.

When precipitated SiO species are produced in a vacuum condensing machine, the above-mentioned low temperature precipitating SiO is particularly selected. This is pulverized into predetermined particle sizes by means of a pulverizer. About the produced SiO powder, the particle sizes are important. About the particle sizes, the average particle size is preferably from 5 to 50 μm, in particular preferably from 10 to 30 μm. This is because: if the powder is too fine, the molded body density does not become high so that the above-mentioned high strength cannot be attained; on the other hand, if the powder is coarse, the moldability becomes difficult.

When the SiO powder is produced as a sintering material, a predetermined binder is used to make the material into a tablet form for an evaporating material (usually, a cylindrical form) The tablet is then sintered. The sintering temperature is preferably from 700 to 1000° C. The temperatures of 700 to 1000° C. are lower temperatures than that in the prior art. Even by such low temperature sintering, a predetermined mechanical strength can be ensured since the above-mentioned low temperature precipitated SiO is used as a starting material, as described above. An extremely low temperature such as less than 700° C. does not give the predetermined mechanical strength certainly even in the low temperature sintering. If the sintering temperature is over 1000° C., Si precipitates in the sintering step so that this causes splash.

The sintering may be according to hot press. However, it is more economical to use a binder for the forming or molding and then sinter the formed body. When the binder is used, the denseness lowers. In the prior art, the use thereof is considered to cause a problem. As described above, however, the denseness does not produce a large effect on the generation of splash. Economical advantageous of the use of the binder are large. In general, a commercially available product can be used as a binder without causing any problem. It is particularly preferred to use a binder that can be removed at a low temperature of 500° C. or lower. The addition amount of the binder is preferably from 15 to 30% by weight. If the amount of the binder is too small, the formability deteriorates. If the amount is too large, the mixed forming materials turn into a slurry form so that the materials will not be formed with ease.

The atmosphere and pressure in the sintering may be an inert atmosphere and an atmospheric pressure, respectively. Especially delicate control is unnecessary.

The following will describe results obtained by examining characteristics of a silicon monoxide based evaporating material produced by such a process.

Precipitated SiO produced by a vacuum condensing machine was divided into high temperature precipitating SiO which precipitated in a high temperature region of 400° C. or higher and low temperature precipitating SiO which precipitated in a low temperature region of less than 400°, and then the SiO species were taken out. Both of the precipitating SiO species were pulverized into an average particle diameter of 20 μm. Each of the SiO species was binder-formed into tablets 30 mm in diameter and 40 mm in height. The sintering temperature was varied from 600 to 1200° C. The atmosphere and pressure in the sintering were rendered an inert atmosphere and an atmospheric pressure, respectively. The used binder was a commercially available binder, and the addition amount was set to 20% by weight.

The compression fracture strength and the bulk density of the produced tablets (evaporating material) were measured. XRD was performed to measure the strength of a Si peak. XRD measuring conditions are shown in Table 1. The ratio of the peak strength P1 at the Si peak point to the base strength P2 (XRD strength ratio: P1/P2) was obtained. The method for obtaining this strength ratio is as described below.

TABLE 1

| Divergent slit | ½ deg |
|---|---|
| Scattering slit | 1 deg |
| Light receiving slit | 0.6 mm |
| Scan speed | 20°/min |
| Scan step | 0.02° |
| Scanning range | 20-60° |

An example of raw data graphs based on the XRD is shown in FIG. 3. 2θ (θ: X-ray incident angle) shows a peak near 28 degrees. This is a Si peak. However, many noises are present. Thus, by the above-mentioned method, the raw data graph is converted to a shift average approximation curve with a data specifying number of 3. The shift average approximation curve obtained by the conversion is FIG. 4. On this shift average approximation curve, the following processing is performed.

An especial peak is not observed in regions before and after the Si peak from which the Si peak region near 28 degrees is excluded. Thus, from strength data in the regions before and after the peak, from which the peak is excluded, a base line (represented by a straight line in the figure) in the peak region, that is, an average strength gradient that is not affected by the peak strength is obtained. From this, the base strength P2 at the peak point is supposed. More specifically, as the regions before and after the peak, from which the peak region is excluded, 24 to 26 degrees and 30 to 32 degrees are selected, respectively. In the regions, the average strength P3 and P4 are obtained, respectively. The average strength P3 and P4 are regarded as the strengths at 25 degrees and 31 degrees, respectively, and the individual points are connected to each other through a straight line. This is used as the base line, that is, the average strength gradient that is not affected by the peak strength. Lastly, the strength at the peak point on the base line is used as the base strength P2.

When the base strength P2 at the peak point is supposed in this way, the ratio of the peak strength 1 at the peak point to the base strength P2 (P1/P2) is calculated. This strength ratio represents the amount of Si in the evaporating material. The evaporating material wherein the Si amount is decreased to set this ratio to 3 or less is the evaporating material of the present invention.

Each of the produced evaporating materials was actually used in a vacuum evaporating test (ion plating) to examine the splash property of the each material. Test conditions are shown in Table 2. Splash was detected as pinholes in the substrate film. The number thereof was counted. The film-forming speed was set into two types, that is, 50 angstroms/sec (low-speed film formation), and 200 angstroms/sec (high-speed film formation). The examination results are shown in Table 3 together with conditions for producing the evaporating material. A compression fracture strength of less than 5 MPa was judged to be unallowable (that of 5 MPa or more was judged to be allowable). A case where the number of pinholes was 50 or more was judged to be unallowable (a case where the number of pinholes was less than 50 was judged to be allowable). A case where the number of pinholes was 20 or less was judged to be good, and a case where the number of pinholes was 10 or less was judged to be very good.

TABLE 2

| Film-forming apparatus | Ion plating apparatus |
|---|---|
| Heating source | Ion beams |
| Material diameter | φ 30 mm: 30 mm in diameter |
| Substrate material | PET film |
| Substrate diameter | φ 80 mm |
| Material/substrate distance | 300 mm |

TABLE 3

| | Producing conditions | | Physical properties | | | Performances (the number of pinholes) | |
|---|---|---|---|---|---|---|---|
| Evaporating material | Starting material | Firing temperature | Compression fracture strength | Bulk density | XRD strength ratio | Low-speed film formation | High-speed film formation |
| A Comparative example | High temperature precipitating SiO | 1000° C. | 4.2 MPa | 1.52 g/cm³ | 2.5 | 20 | 22 |
| B Prior art example | | 1200° C. | 22 Mpa | 1.85 g/cm³ | 5.8 | 22 | 34 |
| C Prior art example | | 1300° C. | 30 MPa or more | 1.92 g/cm³ | 9.5 | 28 | 43 |
| D Prior art example | | 1400° C. | 30 MPa or more | 2.02 g/cm³ | 10.5 | 30 | 50 |
| E Comparative example | Low temperature precipitating SiO | 600° C. | 1 MPa or less | 1.38 g/cm³ | 1.1 | 25 | 30 |
| F Present Invention | | 700° C. | 5.8 Mpa | 1.60 g/cm³ | 1.8 | 5 | 10 |
| G Present Invention | | 900° C. | 8.6 Mpa | 1.65 g/cm³ | 2.3 | 10 | 12 |
| H Present Invention | | 1000° C. | 12.5 Mpa | 1.72 g/cm³ | 2.5 | 12 | 18 |
| I Comparative example | | 1200° C. | 30 MPa or more | 1.95 g/cm³ | 5.8 | 27 | 32 |

The evaporating materials A to D are materials about which high temperature precipitating SiO is used as a starting material as in the prior art. The evaporating material A is a comparative example, about which the sintering temperature of the SiO powder is low so that the XRD strength ratio is small and the splash property is comparative good, but the compression fracture strength influencing the convenience for use is low. The evaporating materials B to D are prior art examples. The sintering temperature thereof is high and the compression fracture strength is high but the XRD strength ratio is large and the splash property is not good.

On the other hand, the evaporating materials E to I are materials wherein low temperature precipitated SiO, which has not been used as a starting material in the prior art, is used. The evaporating material E is a comparative example, wherein low temperature precipitated SiO is used. However, the sintering temperature is extremely low to cause a problem about compression fracture strength. The XRD strength ratio is small but the splash property is not good. This would be because the tablet is brittle and the SiO powder constituting the tablet is scattered in the formation of the film. On the other hand, the evaporating material F to H are examples of the present invention, wherein low temperature precipitated SiO, which has not been used as a starting material in the prior art, is used. By the use, the sintering temperature is controlled into a comparative low temperature but a high compression fracture strength is retained. By the control of the sintering temperature into the comparative low temperature, the precipitation of Si is restrained in the sintering step and the XRD strength ratio is controlled into 3 or less. Thus, the splash property is good even by the high-speed film formation. The evaporating material 1 is a comparative example, about which the sintering temperature is high so that the XRD strength ratio is over 3 and the splash property is deteriorated.

BRIEF DESCRIPTION OF THE DRAWINGS

FIG. 2 is a structural view of a vacuum condensing machine used to produce a starting material (precipitating SiO);

EXPLANATION OF REFERENCE NUMBERS

Figure 1:
FIG. 1 is an explanatory view of a production process of a silicon monoxide based evaporating material of the present invention.
Figure 1:
Figure 1:
Figure 3:
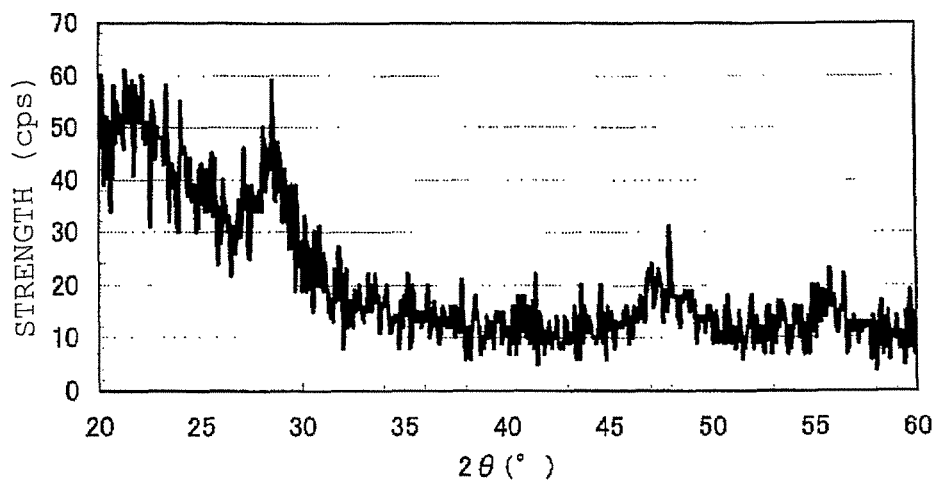
FIG. 3 is an XRD raw data graph of a produced evaporating material.
Figure 4:
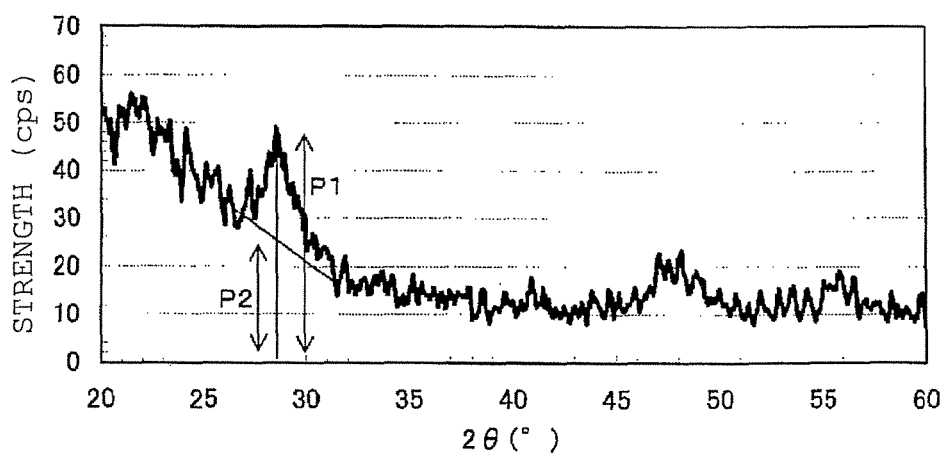
FIG. 4 is a shift average approximation curve chart obtained from the XRD raw data graph.

1 Starting material chamber
2 Condensing chamber

The invention claimed is:

1. A composition comprising silicon monoxide in the form of a powder-sintered body which is operable for forming an evaporated film of silicon monoxide,
wherein the composition has the following property: when converted by use of a data specifying number of 3, a raw data graph obtained by XRD to give a shift average approximation curve, the relationship between the peak strength P1 at a Si peak point generated near $2\theta=28°$ on the curve and the base strength P2 at the peak point expected from the average gradient before and after the peak point satisfies the following relationship: $P1/P2 \leqq 3$, and wherein the composition has a compression fracture strength of 5 MPa or more.

2. The composition of claim 1, which is in the form of a tablet.

3. The composition of claim 1, which is in the form of a cylinder.

4. The composition of claim 1, which has a compression fracture strength of 10 MPa or more.

* * * * *